(12) United States Patent
Liu

(10) Patent No.: US 9,959,994 B1
(45) Date of Patent: May 1, 2018

(54) KEYBOARD

(71) Applicant: PRIMAX ELECTRONICS LTD., Taipei (TW)

(72) Inventor: Chien-Hung Liu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days. days.

(21) Appl. No.: 15/410,943

(22) Filed: Jan. 20, 2017

(30) Foreign Application Priority Data

Oct. 28, 2016 (TW) .............................. 105135078 A

(51) Int. Cl.
*H01H 13/81* (2006.01)
*H01H 3/12* (2006.01)
*H01H 13/52* (2006.01)
*H05K 1/18* (2006.01)

(52) U.S. Cl.
CPC .............. *H01H 13/81* (2013.01); *H01H 3/12* (2013.01); *H01H 13/52* (2013.01); *H05K 1/181* (2013.01); *H05K 2201/10053* (2013.01); *H05K 2201/10507* (2013.01)

(58) Field of Classification Search
CPC ................. H01H 13/705; H01H 13/83; H01H 2219/062; H01H 13/52; H01H 13/14; H01H 13/807; H01H 13/86; H01H 13/88; H01H 2223/014; H01H 2223/058; H01H 2231/002; H01H 3/125; H01H 71/04; H01H 1/5805; H03K 17/962; H03K 17/9622; H03K 2217/960755; H03K 17/975; H03K 2017/9602

USPC ...... 200/314, 341–345, 559, 532, 246, 16 C, 200/283, 276.1, 276, 535, 292, 293, 294, 200/5 A, 600

See application file for complete search history.

(56) References Cited

U.S. PATENT DOCUMENTS

| | | | | |
|---|---|---|---|---|
| 5,399,824 | A * | 3/1995 | Chen | H01H 13/705 200/345 |
| 7,745,743 | B2 * | 6/2010 | Liu | G08C 23/04 200/341 |
| 2006/0000699 | A1 * | 1/2006 | Sasaki | H01H 13/023 200/341 |
| 2013/0140165 | A1 * | 6/2013 | Lin | G06F 3/0202 200/5 A |
| 2016/0055988 | A1 * | 2/2016 | Muller | H01H 13/023 200/314 |
| 2016/0079011 | A1 * | 3/2016 | Plancherel | H01H 13/14 200/314 |

(Continued)

*Primary Examiner* — Ahmed Saeed
(74) *Attorney, Agent, or Firm* — Kirton McConkie; Evan R. Witt

(57) ABSTRACT

A keyboard includes a base plate, a pressure sensing layer, plural key structures, a circuit board, a flexible layer and a controlling unit. The pressure sensing layer is disposed on the base plate and located under the circuit board. The flexible layer is disposed on the pressure sensing layer and located under the circuit board. While a key structure is depressed, a part of the key structure is penetrated through the circuit board to press the flexible layer, and a force is transmitted from the flexible layer to the pressure sensing layer. The controlling unit compares the force with a predetermined force value. According to the comparing result, the controlling unit generates a corresponding pressure sensing signal. Consequently, the use of a single key structure can achieve the functions of multiple keys.

10 Claims, 6 Drawing Sheets

(56) References Cited

U.S. PATENT DOCUMENTS

2016/0154462 A1\* 6/2016 Haga ................. G06F 3/016
                                                                          345/174

\* cited by examiner

KEYBOARD

FIELD OF THE INVENTION

The present invention relates to a keyboard, and more particularly to a keyboard with a mechanical key structure.

BACKGROUND OF THE INVENTION

Generally, the widely-used peripheral input device of a computer system includes for example a mouse, a keyboard, a trackball, or the like. Via the keyboard, characters or symbols can be inputted into the computer system directly. As a consequence, most users and most manufacturers of input devices pay much attention to the development of keyboards. As known, a keyboard with scissors-type connecting elements is one of the widely-used keyboards.

The key structure of a keyboard will be described as follows. The key structure comprises a scissors-type connecting element. FIG. 1 is a schematic side cross-sectional view illustrating a key structure of a conventional keyboard. As shown in FIG. 1, the conventional key structure 1 comprises a keycap 11, a scissors-type connecting element 12, a rubbery elastomer 13, a membrane switch circuit member 14 and a base plate 15. The keycap 11, the scissors-type connecting element 12, the rubbery elastomer 13 and the membrane switch circuit member 14 are supported by the base plate 15. The scissors-type connecting element 12 is used for connecting the base plate 15 and the keycap 11.

The membrane switch circuit member 14 comprises plural key intersections (not shown). When one of the plural key intersections is triggered, a corresponding key signal is generated. The rubbery elastomer 13 is disposed on the membrane switch circuit member 14. Each rubbery elastomer 13 is aligned with a corresponding key intersection. When the rubbery elastomer 13 is depressed, the rubbery elastomer 13 is subjected to deformation to push the corresponding key intersection of the membrane switch circuit member 14. Consequently, the corresponding key signal is generated.

The scissors-type connecting element 12 is arranged between the base plate 15 and the keycap 11, and the base plate 15 and the keycap 11 are connected with each other through the scissors-type connecting element 12. The scissors-type connecting element 12 comprises a first frame 121 and a second frame 122. A first end of the first frame 121 is connected with the keycap 11. A second end of the first frame 121 is connected with the base plate 15. The rubbery elastomer 13 is enclosed by the scissors-type connecting element 12. Moreover, the first frame 121 comprises a first keycap post 1211 and a first base plate post 1212. The first frame 121 is connected with the keycap 11 through the first keycap post 1211. The first frame 121 is connected with the base plate 15 through the first base plate post 1212. The second frame 122 is combined with the first frame 121. A first end of the second frame 122 is connected with the base plate 15. A second end of the second frame 122 is connected with the keycap 11. Moreover, the second frame 122 comprises a second keycap post 1221 and a second base plate post 1222. The second frame 122 is connected with the keycap 11 through the second keycap post 1221. The second frame 122 is connected with the base plate 15 through the second base plate post 1222.

The operations of the conventional key structure 1 in response to the depressing action of the user will be illustrated as follows. Please refer to FIG. 1 again. When the keycap 11 is depressed, the keycap 11 is moved downwardly to push the scissors-type connecting element 12 in response to the depressing force. As the keycap 11 is moved downwardly relative to the base plate 15, the keycap 11 pushes the corresponding rubbery elastomer 13. At the same time, the rubbery elastomer 13 is subjected to deformation to push the membrane switch circuit member 14 and trigger the corresponding key intersection of the membrane switch circuit member 14. Consequently, the membrane switch circuit member 14 generates a corresponding key signal. When the keycap 11 is no longer depressed by the user, no external force is applied to the keycap 11 and the rubbery elastomer 13 is no longer pushed by the keycap 11. In response to the elasticity of the rubbery elastomer 13, the rubbery elastomer 13 is restored to its original shape to provide an upward elastic restoring force. Consequently, the keycap 11 is returned to its original position where it is not depressed.

With increasing development of science and technology, a mechanical key structure is introduced into the market. The mechanical key structure can provide better tactile feel. FIG. 2 is a schematic side cross-sectional view illustrating a conventional mechanical key structure. As shown in FIG. 2, the mechanical key structure 2 comprises a keycap (not shown), a pedestal 21, an upper cover 22, a push element 23, a linkage element 24, a first spring strip 25, a second spring strip 26 and a circuit board (not shown). The circuit board is located outside the pedestal 21. The pedestal 21 is covered by the upper cover 22. The upper cover 22 has an opening 221. The linkage element 24 is located at a middle region of the pedestal 21. Moreover, the linkage element 24 is movable upwardly or downwardly relative to the pedestal 21. The second spring strip 26 is partially disposed within the pedestal 21, and arranged between the linkage element 24 and the first spring strip 25. The push element 23 and the linkage element 24 are collaboratively disposed on the pedestal 21. The push element 23 is penetrated through the opening 221 of the upper cover 22 and coupled with the keycap. Moreover, the first spring strip 25 and the second spring strip 26 are electrically connected with the circuit board.

Please refer to FIG. 2 again. The linkage element 24 has a protrusion structure 241. The protrusion structure 241 is extended from a sidewall of the linkage element 24 toward the first spring strip 25. Moreover, the first spring strip 25 comprises a fixing part 251 and an elastic part 252. The fixing part 251 is fixed on the pedestal 21. The elastic part 252 is extended from the fixing part 251. Moreover, the elastic part 252 is contacted with the protrusion structure 241 of the linkage element 24. Consequently, the elastic part 252 is movable relative to the fixing part 251.

While the keycap is depressed by the user, the keycap is moved downwardly to push the push element 23. Consequently, the linkage element 24 connected with the push element 23 is moved downwardly. As the linkage element 24 is moved downwardly, the protrusion structure 241 of the linkage element 24 is contacted with the elastic part 252 and moved downwardly along the elastic part 252. While the linkage element 24 is quickly moved in response to the depressing force of the user, the linkage element 24 is quickly moved across the elastic part 252, and the elastic part 252 is pushed by the protrusion structure 241 of the linkage element 24. Consequently, the elastic part 252 is moved relative to the fixing part 251 to collide with the second spring strip 26. Since the first spring strip 25 and the second spring strip 26 are contacted with each other, the circuit board outputs a corresponding key signal. Moreover, while the first spring strip 25 and the second spring strip 26 are contacted with each other, a click sound is generated. Due to the click sound, the user can feel the depressing feedback.

Since the mechanical key structure 2 generates the click sound to provide the feedback feel while the keycap is depressed, the mechanical key structure 2 is favored by some users. However, the conventional mechanical key structure 2 still has some drawbacks. For example, due to the design limitation of the mechanical key structure 2, the functionality is usually unsatisfied. That is, the conventional mechanical structure cannot provide multiple functions to meet the user's requirements.

Therefore, there is a need of providing a keyboard with enhanced functionality.

SUMMARY OF THE INVENTION

The present invention provides a keyboard with enhanced functionality.

In accordance with an aspect of the present invention, there is provided a keyboard. The keyboard includes a base plate, a circuit board, plural key structures, a pressure sensing layer, a flexible layer and a controlling unit. The circuit board is located over the base plate. The circuit board includes at least one circuit board opening. The plural key structures are located over the circuit board. When at least one of the key structures is depressed, the at least one key structure is penetrated through the corresponding circuit board opening. The pressure sensing layer is disposed on the base plate and located under the circuit board. While the at least one key structure is depressed, the at least one key structure provides a pressing force and the pressing force is detected by the pressure sensing layer. The flexible layer is arranged between the pressure sensing layer and the circuit board. When the flexible layer is pressed by the at least one key structure, the pressure sensing layer is pushed by the flexible layer. The controlling unit is disposed on the circuit board and electrically connected with the pressure sensing layer. The control unit generates a pressure sensing signal according to the pressing force.

From the above descriptions, the present invention provides the keyboard. The pressure sensing layer and the flexible layer are arranged between the circuit board and the base plate. The controlling unit compares the pressing force with a predetermined force value. According to the comparing result, the controlling unit generates a corresponding pressure sensing signal. Consequently, the use of a single key structure can achieve the functions of multiple keys. Since different commands are executed according to different pressure sensing signals, the functions of the key structure are increased. Moreover, the flexible layer has a one-piece structure. Consequently, the flexible layer not only transfers the pressing force to the pressure sensing layer but also provides better tactile feel to the user. Moreover, the pressure sensing layer is disposed on the flat base plate. Since the pressure sensing layer is not disposed on the uneven component (e.g., the top surface of the circuit board), the sensitivity of the pressure sensing layer of the present invention is increased. Moreover, since the pressure sensing layer is located under the circuit board, the wiring layout of the circuit board is not adversely affected by the pressure sensing layer.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For solving the drawbacks of the conventional technologies, the present invention provides a keyboard.

Figure 1:
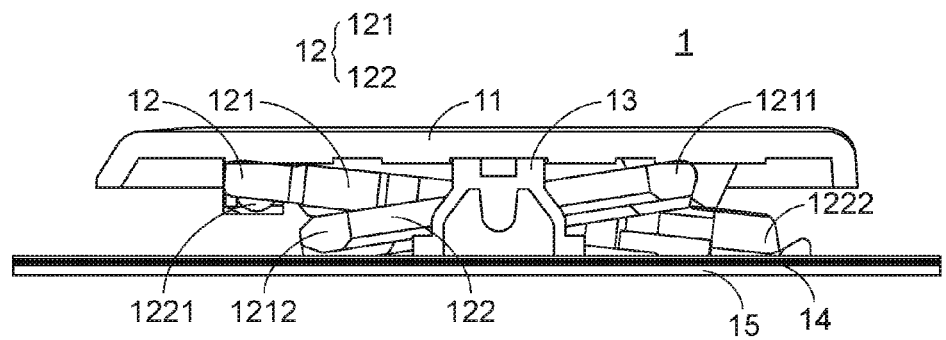
FIG. 1 is a schematic side cross-sectional view illustrating a key structure of a conventional keyboard.
Figure 2:
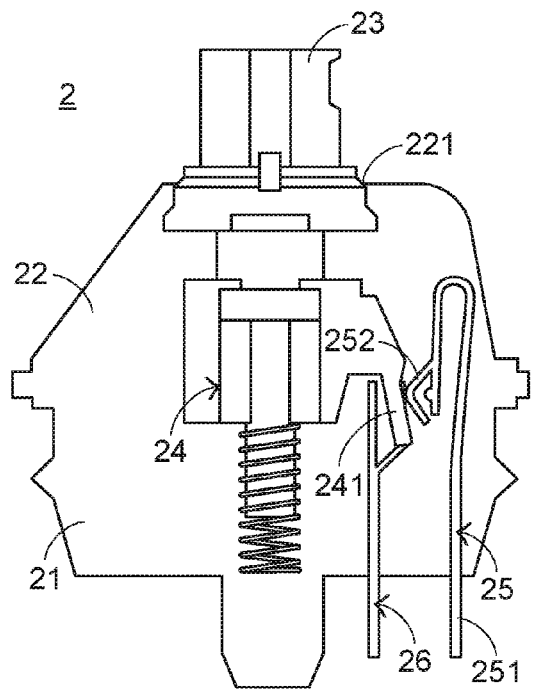
FIG. 2 is a schematic side cross-sectional view illustrating a conventional mechanical key structure.
Figure 3:
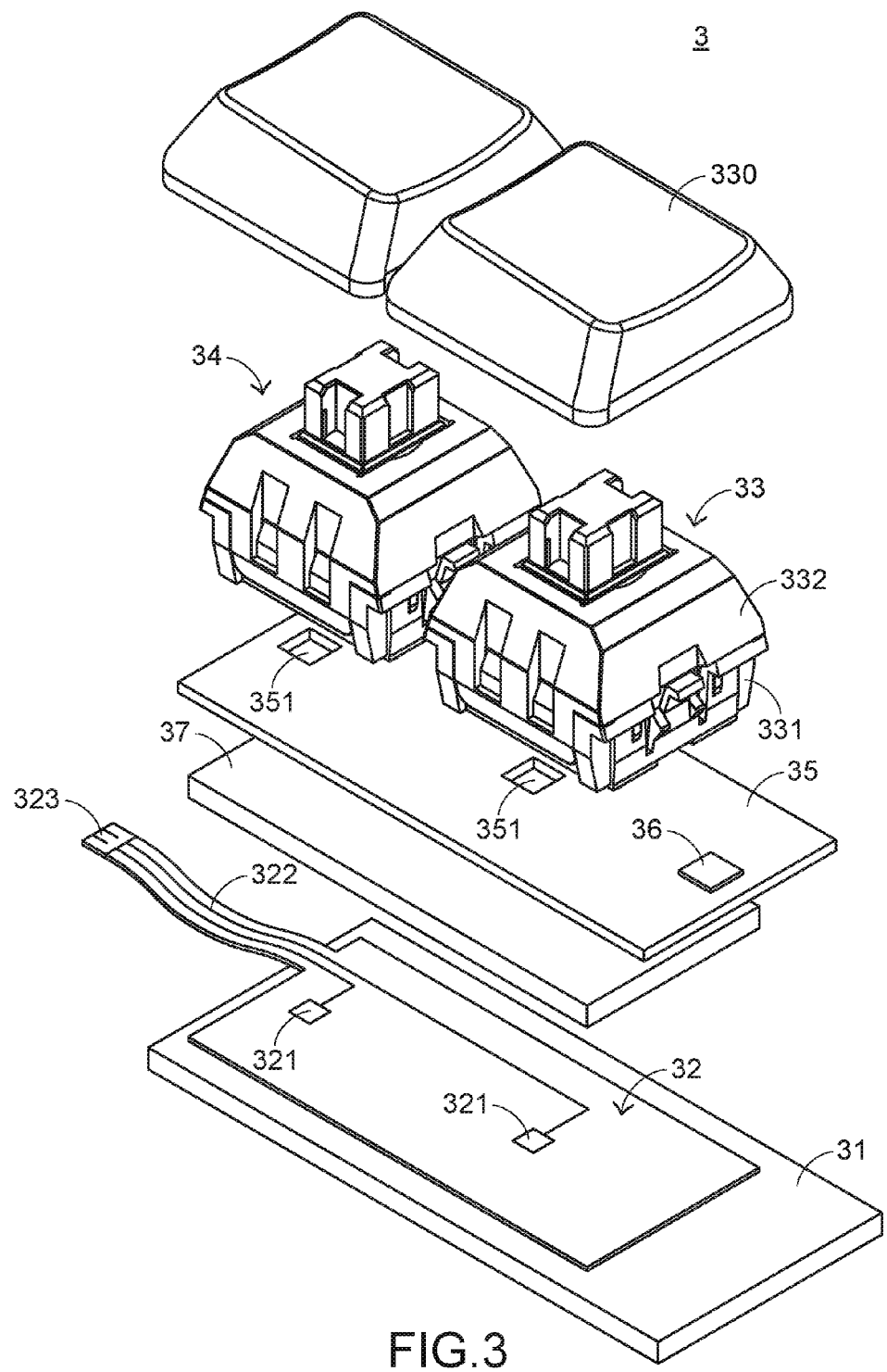
FIG. 3 is a schematic exploded view illustrating a portion of a keyboard according to a first embodiment of the present invention.
Figure 4:
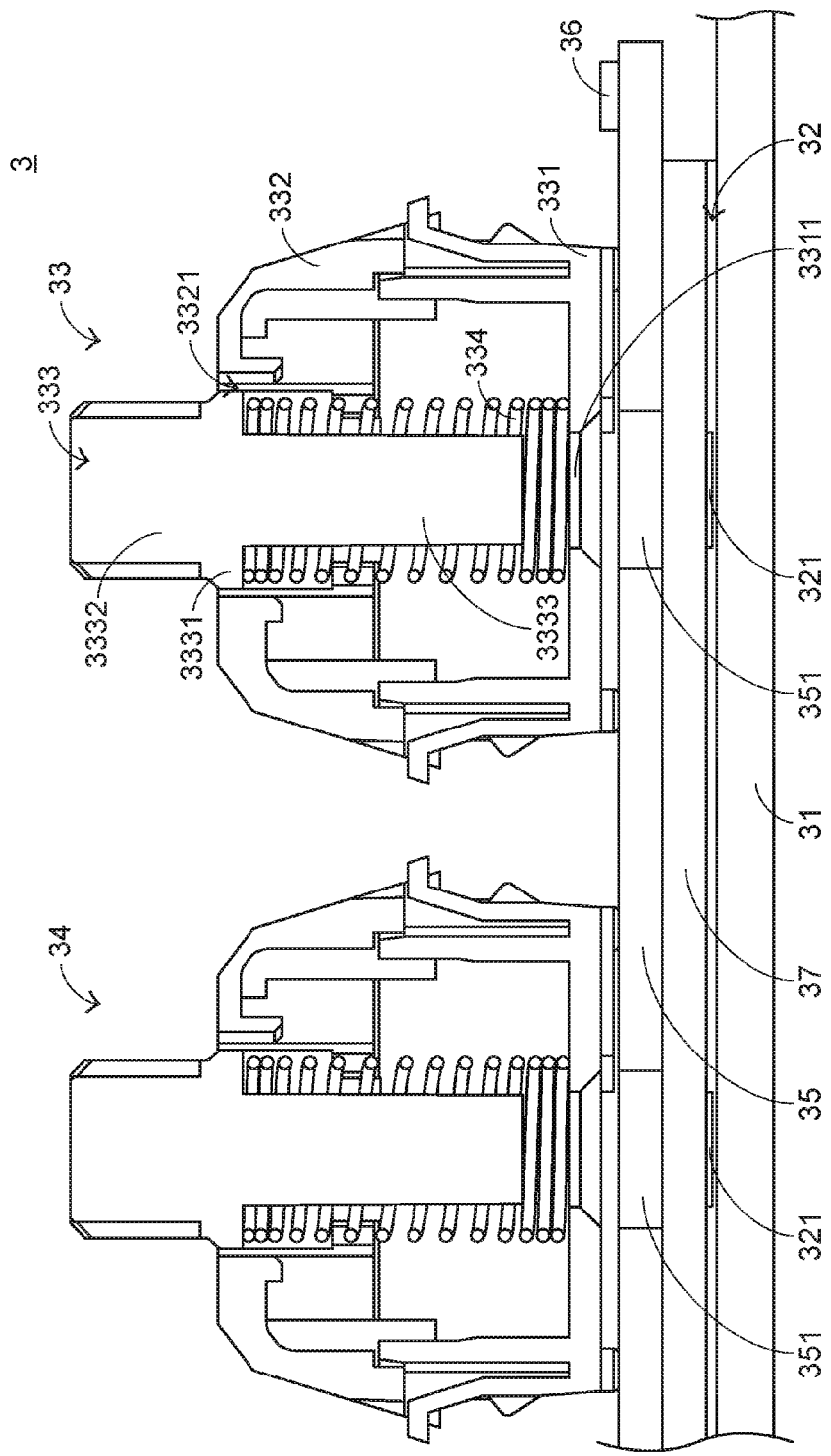
FIG. 4 is a schematic side cross-sectional view illustrating a portion of the keyboard according to the first embodiment of the present invention.

FIG. 3 is a schematic exploded view illustrating a portion of a keyboard according to a first embodiment of the present invention. FIG. 4 is a schematic side cross-sectional view illustrating a portion of the keyboard according to the first embodiment of the present invention. As shown in FIGS. 3 and 4, the keyboard 3 comprises a base plate 31, a pressure sensing layer 32, a first key structure 33, a second key structure 34, a circuit board 35, a controlling unit 36 and a flexible layer 37. It is noted that the keyboard 3 comprises plural key structures. For succinctness and clarification, only the first key structure 33 and the second key structure 34 are shown in the drawings.

The circuit board 35 is disposed over the base plate 31. Moreover, the circuit board 35 comprises plural circuit board openings 351. Each of the plural circuit board openings 351 is aligned with one key structure. The first key structure 33 and the second key structure 34 are located over the circuit board 35. When the first key structure 33 or the second key structure 34 is depressed, a part of the first key structure 33 or a part of the second key structure 34 is penetrated through the corresponding circuit board opening 351. In an embodiment, the circuit board 35 is a printed circuit board (PCB). It is noted that the example of the circuit board 35 is not restricted. For example, in another embodiment, the circuit board is a flexible printed circuit (FPC).

The pressure sensing layer 32 is disposed on the base plate 31, and located under the circuit board 35. The pressure sensing layer 32 comprises plural pressure sensing regions 321. The plural pressure sensing regions 321 are electrically connected with the circuit board 35. Each pressure sensing region 321 is aligned with a corresponding key structure. In response to the action of the key structure, the pressure sensing region 321 receives and detects the pressing force from the corresponding key structure.

The flexible layer 37 is arranged between the pressure sensing layer 32 and the circuit board 35. When the flexible layer 37 is pressed by the first key structure 33 or the second key structure 34, the corresponding pressure sensing region 321 of the pressure sensing layer 32 is pushed by the flexible layer 37. The controlling unit 36 is disposed on the circuit board 35 and electrically connected with the pressure sensing layer 32. According to the pressing force received by the pressure sensing layer 32, the controlling unit 36 generates a corresponding pressure sensing signal. In this embodiment, the first key structure 33 and the second key structure 34 are aligned with the same flexible layer 37, and the flexible layer 37 is made of rubbery material or foam material. That is, the flexible layer 37 is a one-piece structure. Moreover, the pressure sensing layer 32 is also a one-piece structure. The one-piece structure is not aligned with one key structure only. That is, the entire of the pressure sensing layer 32 and the entire of the flexible layer 37 are aligned with the plural key structures.

When the first key structure 33 or the second key structure 34 is depressed, the pressing force is generated. The controlling unit 36 judges the magnitude of the pressing force through the pressure sensing layer 32 and generates the corresponding pressure sensing signal. For example, when the first key structure 33 is depressed by the user, the pressing force exerted on the first key structure 33 is detected by the controlling unit 36 through the pressure sensing layer 32. If the magnitude of the pressing force is higher than or equal to a predetermined force value, the controlling unit 36 generates the pressure sensing signal corresponding to a first function. Whereas, if the magnitude of the pressing force is lower than the predetermined force value, the controlling unit 36 generates the pressure sensing signal corresponding to a second function. In an embodiment, the controlling unit 36 is a firmware component that is disposed on the circuit board 35. It is noted that the example of the controlling unit is not restricted. For example, in another embodiment, the controlling unit is a microprocessor that is disposed on the circuit board.

The inner components of the first key structure 33 will be described as follows. Please refer to FIGS. 3 and 4 again. The first key structure 33 comprises a keycap 330, a pedestal 331, an upper cover 332, a triggering element 333 and an elastic element 334. The pedestal 331 comprises a pedestal opening 3311. The pedestal opening 3311 is formed in the lower portion of the pedestal 331. Moreover, the pedestal opening 3311 is aligned with the corresponding circuit board opening 351. The pedestal 331 is covered by the upper cover 332. Moreover, the upper cover 332 has an upper cover opening 3321 corresponding to the triggering element 333. The keycap 330 is connected with a first end of the triggering element 333 through the upper cover opening 3321. The triggering element 333 is installed on the pedestal 331, and penetrated through the upper cover opening 3321 so as to be connected with the keycap 330. While the triggering element 333 is depressed by the user, the triggering element 333 is moved relative to the pedestal 331. Consequently, a part of the triggering element 333 is penetrated through the pedestal opening 3311 and the circuit board opening 351 to press the flexible layer 37 and trigger the corresponding pressure sensing region 321.

As shown in FIG. 4, the triggering element 333 comprises a main body 3331, a coupling part 3332 and a push part 3333. The main body 3331 is movable relative to the pedestal 331. The coupling part 3332 is located at a first end of the main body 3331 and connected with the keycap 330. The push part 3333 is located at a second end of the main body 3331 and aligned with the pedestal opening 3311. While the main body 3331 is moved relative to the pedestal 331, the push part 3333 is sequentially penetrated through the pedestal opening 3311 and the corresponding circuit board opening 351 to press the flexible layer 37. Consequently, the corresponding pressure sensing region 321 is pushed by the flexible layer 37. Moreover, the elastic element 334 is sheathed around the push part 3333 of the triggering element 333 and contacted with the pedestal 331. The elastic element 334 provides an elastic force to the triggering element 333. In response to the elastic force, the triggering element 333 is moved upwardly relative to the pedestal 331.

In an embodiment, the elastic element 334 is a helical spring, and the main body 3331, the coupling part 3332 and the push part 3333 are integrally formed with each other. It is noted that numerous modifications and alterations may be made while retaining the teachings of the invention. For example, in another embodiment, the coupling part and the push part are assembled with the main body 3331. The inner components of the second key structure 34 are similar to those of the first key structure 33, and are not redundantly described herein.

Figure 5:
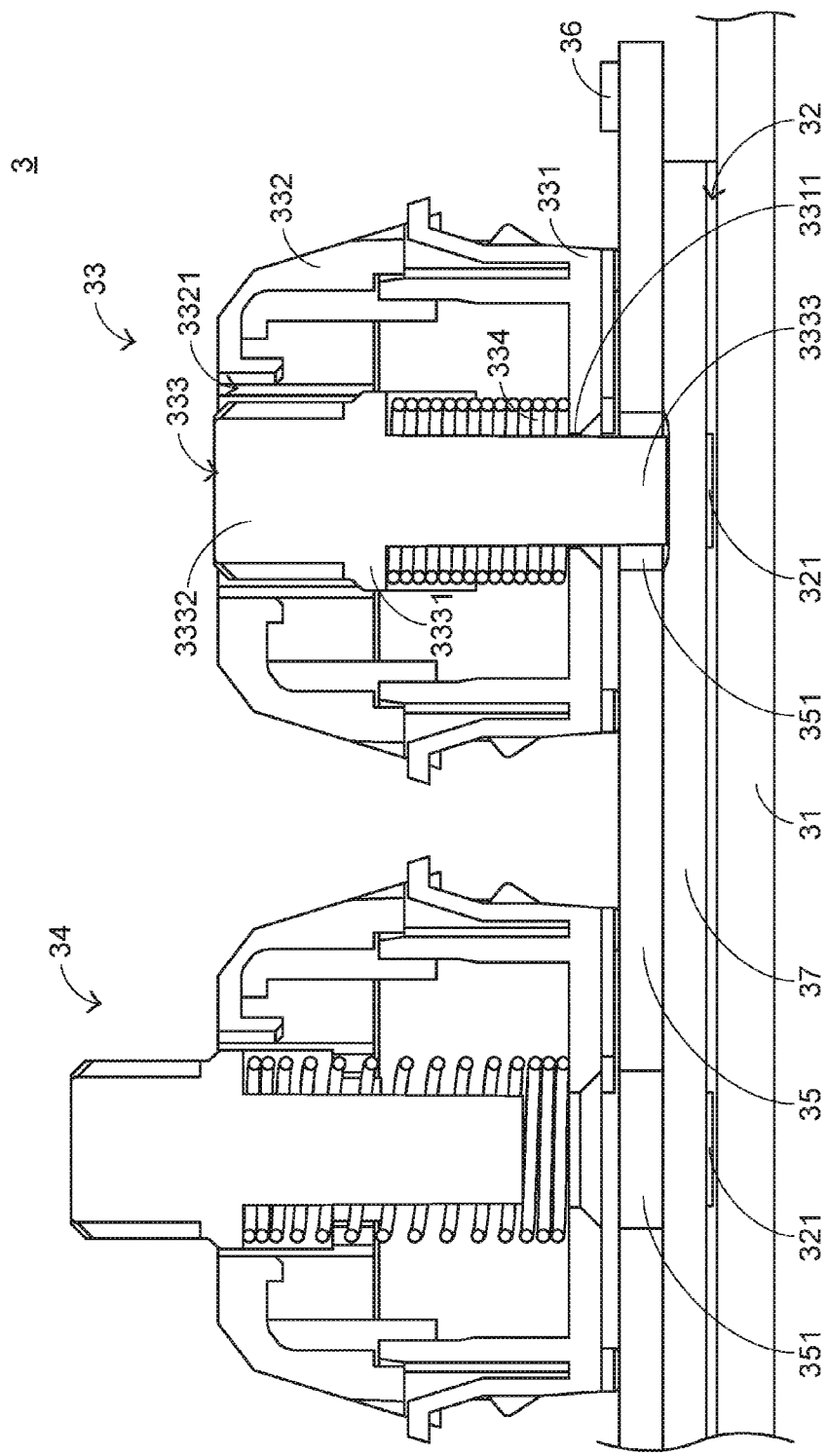
FIG. 5 is a schematic side cross-sectional view illustrating a portion of the keyboard according to the first embodiment of the present invention, in which the keycap of the first key structure is depressed.

The operations of the first key structure 33 of the keyboard 3 in response to the depressing action of the user will be illustrated in more details as follows. Please refer to FIGS. 3, 4 and 5. FIG. 5 is a schematic side cross-sectional view illustrating a portion of the keyboard according to the first embodiment of the present invention, in which the keycap of the first key structure is depressed.

While the keycap 330 of the first key structure 33 is depressed by the user, the keycap 330 is moved downwardly to push the triggering element 333 in response to the pressing force. As the keycap 330 is moved downwardly, the triggering element 333 is moved downwardly relative to the pedestal 331. While the triggering element 333 is moved downwardly, the elastic element 334 is compressed by the main body 3331 of the triggering element 333 and the keycap 330 is moved to generate a travelling distance (see FIG. 5). Moreover, as the main body 3331 is moved downwardly, the push part 3333 connected with the main body 3331 is correspondingly moved downwardly. Consequently, the push part 3333 is sequentially penetrated through the pedestal opening 3311 and the corresponding circuit board opening 351 to press the flexible layer 37. Since a portion of the pressing force is absorbed by the flexible layer 37, the pressing force is attenuated. The attenuated pressing force is transmitted to the corresponding pressure sensing region 321. That is, the corresponding pressure sensing region 321 is pushed by the flexible layer 37. After the corresponding pressure sensing region 321 receives the attenuated pressing force and senses the magnitude of the attenuated pressing force, the magnitude of the attenuated pressing force is transmitted from the pressure sensing region 321 to the controlling unit 36. As mentioned above, while the pressing force is transmitted to the pressure sensing region 321, a portion of the pressing force is absorbed by the flexible layer 37. Consequently, the magnitude of the force received by the pressure sensing region 321 is lower than the pressing force. That is, the pressing force is attenuated.

Then, the controlling unit 36 compares the magnitude of the received force with the predetermined force value. If the magnitude of the received force is lower than the predetermined force value, the controlling unit 36 generates the pressure sensing signal corresponding to the second function. Whereas, if the magnitude of the received force is higher than or equal to the predetermined force value, the controlling unit 36 generates the pressure sensing signal corresponding to the first function. Take the Delete key for example. If the magnitude of the attenuated pressing force is lower than the predetermined force value, the controlling unit 36 generates the pressure sensing signal corresponding to the second function. According to the pressure sensing signal corresponding to the second function, the function of normally depressing the Delete key is executed. That is, one character or symbol is deleted. On the other hand, if the magnitude of the attenuated pressing force is higher than or equal to the predetermined force value, the controlling unit 36 generates the pressure sensing signal corresponding to the first function. According to the pressure sensing signal corresponding to the second function, the function of continuously depressing the Delete key is executed. That is, plural characters or symbols are deleted at a time. The example of depressing the Delete key is presented herein for purpose of illustration and description only.

When the keycap 330 is no longer depressed by the user, no external force is applied to the keycap 330. In response to the elasticity of the elastic element 334, the compressed elastic element 334 is restored to its original shape to provide an elastic force to the triggering element 333. In response to the elastic force, the triggering element 333 is moved upwardly relative to the pedestal 331 and returned to its original position where it is not depressed.

Please refer to FIG. 3 again. The pressure sensing layer 32 of the keyboard 3 of the present invention comprises plural pressure sensing regions 321. The electrical traces 322 of the plural pressure sensing regions 321 are formed in the pressure sensing layer 32, and an electrical connection part 323 is located at a side of the pressure sensing layer 32. The pressure sensing layer 32 is electrically connected with the circuit board 35 through the electrical connection part 323. Consequently, the electrical connection between the pressure sensing layer 32 and the circuit board 35 is established.

Moreover, while the first key structure 33 and the second key structure 34 of the keyboard 3 are heavily depressed, the first key structure 33 and the second key structure 34 of the keyboard 3 can be set as consecutive buttons. The functions of the consecutive buttons are similar to accelerator pedals in cars. For example, when the key structure corresponding to the down arrow is continuously depressed by the user, the scroll bar shown on the computer window (not shown) is moved downwardly. While the key structure is depressed lightly, the scroll bar is moved downwardly at a slower speed. While the key structure is depressed heavily, the speed of moving the scroll bar downwardly is gradually increased. In some embodiments, the function of the consecutive button is applied to the game software to increase the convenience of operating the keyboard. Consequently, the keyboard 3 of the present invention provides the function of the consecutive button to increase the operating convenience.

Figure 6:
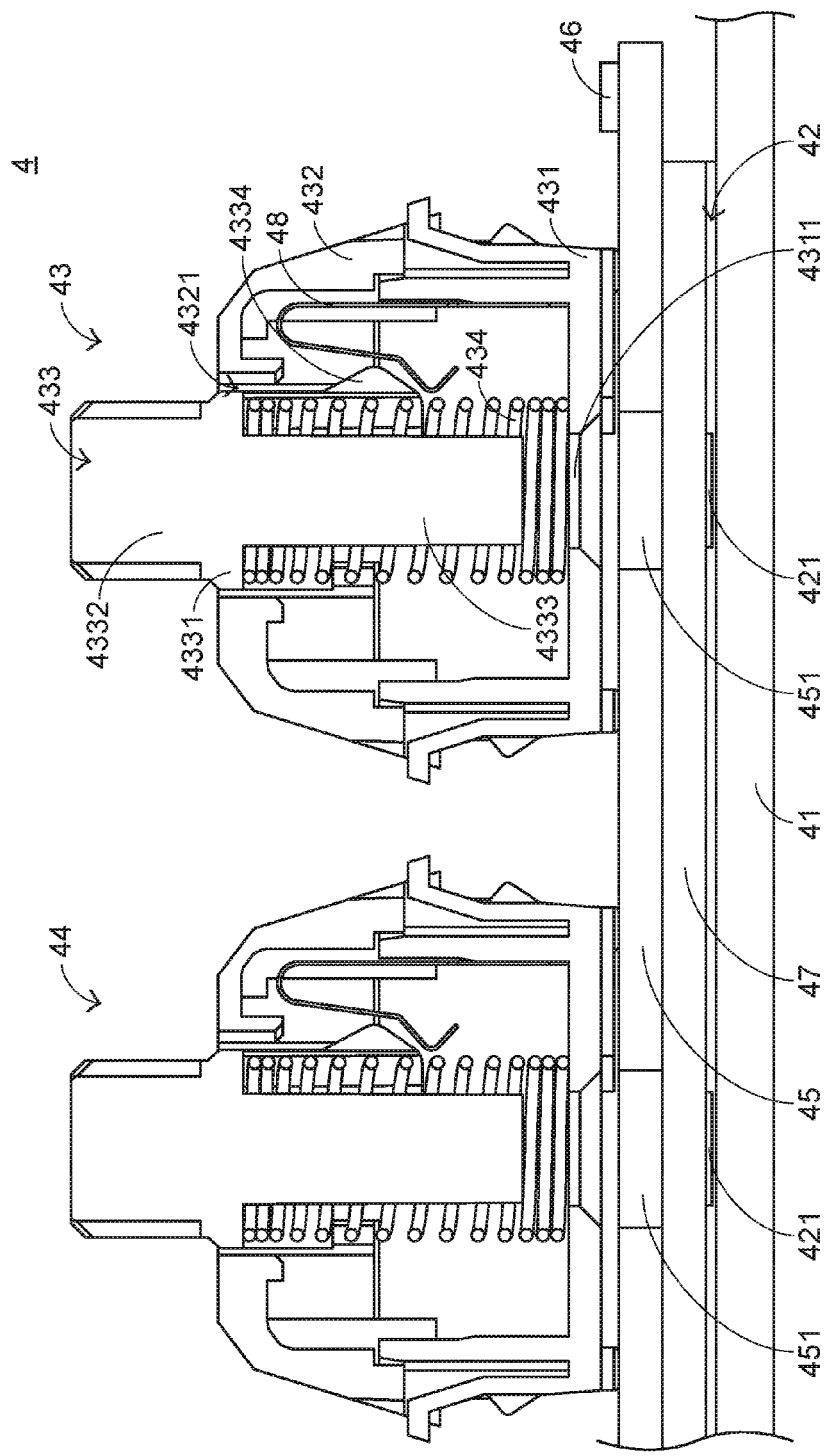
FIG. 6 is a schematic side cross-sectional view illustrating a portion of a keyboard according to a second embodiment of the present invention.

The present invention further provides a second embodiment, which is distinguished from the first embodiment. FIG. 6 is a schematic side cross-sectional view illustrating a portion of a keyboard according to a second embodiment of the present invention. As shown in FIG. 6, the keyboard 4 comprises a base plate 41, a pressure sensing layer 42, a first key structure 43, a second key structure 44, a circuit board 45, a controlling unit 46 and a flexible layer 47. The pressure sensing layer 42 comprises plural pressure sensing regions 421. The circuit board 45 comprises plural circuit board opening 451. The pedestal 431 comprises a pedestal opening 4311. Moreover, the upper cover 432 has an upper cover opening 4321 corresponding to the triggering element 433. The structures and functions of the components of the keyboard 4 which are identical to those of the first embodiment are not redundantly described herein. In comparison with the first embodiment, the first key structure 43 of the keyboard 4 of this embodiment is distinguished.

Please refer to FIG. 6 again. The first key structure 43 comprises a keycap (not shown), a pedestal 431, an upper cover 432, a triggering element 433 and an elastic element 434. The triggering element 433 comprises a main body 4331, a coupling part 4332, a push part 4333 and a collision part 4334. The structures of the keycap, the pedestal 431, the upper cover 432, the elastic element 434, the main body 4331, the coupling part 4332 and the push part 4333 are similar to those of the first embodiment, and are not redundantly described herein. The collision part 4334 is extended externally from the main body 4331 and arranged beside the push part 4331. The keyboard 4 further comprises a spring strip 48. The spring strip 48 is installed on the pedestal 41 and arranged beside the triggering element 433. While the first key structure 43 is depressed by the user, the above operation of the first key structure 43 is also performed. Moreover, while the main body 4331 is moved relative to the pedestal 431, the spring strip 48 is collided by the collision part 4334. Consequently, a sound is generated, and a depressing feedback is provided to the user.

Figure 7:
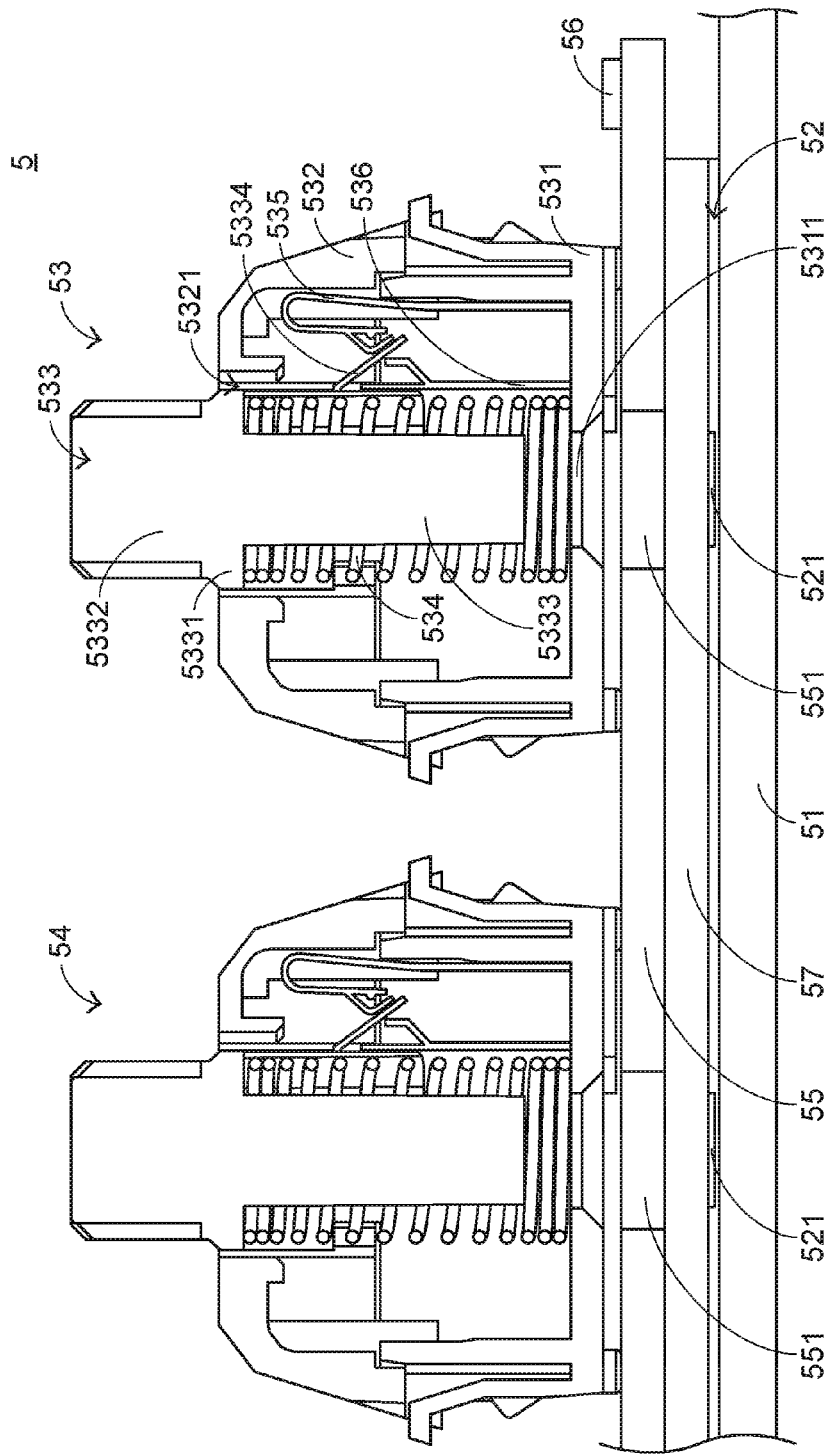
FIG. 7 is a schematic side cross-sectional view illustrating a portion of a keyboard according to a third embodiment of the present invention.

The present invention further provides a third embodiment, which is distinguished from the above embodiments. FIG. 7 is a schematic side cross-sectional view illustrating a portion of a keyboard according to a third embodiment of the present invention. As shown in FIG. 7, the keyboard 5 comprises a base plate 51, a pressure sensing layer 52, a first key structure 53, a second key structure 54, a circuit board 55, a controlling unit 56 and a flexible layer 57. The pressure sensing layer 52 comprises plural pressure sensing regions 521. The circuit board 55 comprises plural circuit board opening 551. The pedestal 531 comprises a pedestal opening 5311. Moreover, the upper cover 532 has an upper cover opening 5321 corresponding to the triggering element 533. The structures and functions of the components of the keyboard 5 which are identical to those of the first embodiment are not redundantly described herein. In comparison with the above embodiments, the first key structure 53 and the operation of the controlling unit 56 are distinguished.

The components of the first key structure 53 will be described as follows. The first key structure 53 comprises a keycap (not shown), a pedestal 531, an upper cover 532, a triggering element 533, an elastic element 534, a first triggering spring strip 535 and a second triggering spring strip 536. The triggering element 533 comprises a main body 5331, a coupling part 5332, a push part 5333 and a collision part 5334. The structures of the keycap, the pedestal 531, the upper cover 532, the triggering element 533 and the elastic element 534 are similar to those of the first embodiment, and are not redundantly described herein. The first triggering spring strip 535 and the second triggering spring strip 536 are disposed on the pedestal 531 and electrically connected with the circuit board 55. The second triggering spring strip 536 is located near the first triggering spring strip 535. That is, the second triggering spring strip 536 is arranged between the collision part 5334 and the first triggering spring strip 535.

The operations of the controlling unit 56 will be described as follows. While the first key structure 53 is depressed by the user, the main body 5331 is moved relative to the pedestal 531. As the first triggering spring strip 535 is moved with the main body 5331, the first triggering spring strip 535 is collided by the collision part 5334. Consequently, a sound is generated. While the first triggering spring strip 535 is collided by the collision part 5334, the first triggering spring strip 535 and the second triggering spring strip 536 are electrically connected with each other. Consequently, the circuit board 55 generates a key signal. Moreover, as the main body 5331 is moved relative to the pedestal 531, the push part 5333 is correspondingly moved to press the flexible layer 57. Consequently, the corresponding pressure sensing region 521 is pushed by the flexible layer 57. Then, the magnitude of the force received by the pressure sensing region 521 is compared with the predetermined force value by the controlling unit 56. If the magnitude of the received force is lower than the predetermined force value, the controlling unit 56 generates the pressure sensing signal corresponding to an off function. Consequently, when the key structure is depressed, the computer (not shown) in communication with the keyboard 5 only executes the function of generating the key signal.

When the first triggering spring strip 535 and the second triggering spring strip 536 are electrically connected with each other and the controlling unit 56 judges that the magnitude of the received force is higher than or equal to the predetermined force value, the controlling unit 56 generates the pressure sensing signal corresponding to the first function. According to the key signal, the computer in communication with the keyboard 5 recognizes the corresponding key. In addition, the computer executes the first function according to the pressure sensing signal corresponding to the first function. For example, the function of continuously depressing the key structure is performed.

In another embodiment, the keyboard of the present invention further comprises a light-emitting element (not shown) to emit a light beam. More especially, the keyboard of the present invention has both of an illuminating function and a pressure sensing function. For example, when the keycap is depressed lightly, the circuit board outputs the corresponding first pressure sensing signal. According to the first pressure sensing signal, the light-emitting element is controlled to generate a light beam with a first lighting effect. Whereas, when the keycap is depressed heavily, the circuit board outputs the corresponding second pressure sensing signal. According to the second pressure sensing signal, the light-emitting element is controlled to generate a light beam with a second lighting effect. For example, the light beam with the first lighting effect is a slow flickering light, and the light beam with the second lighting effect is a fast flickering light. According to the lighting effect, the user can recognize whether a lightly depressed function or a heavily depressed function is enabled. It is noted that the cooperative functions of the key structure are not restricted to the illuminating function and the pressure sensing function.

From the above descriptions, the present invention provides the keyboard. The pressure sensing layer and the flexible layer are arranged between the circuit board and the base plate. The controlling unit compares the pressing force with a predetermined force value. According to the comparing result, the controlling unit generates a corresponding pressure sensing signal. Consequently, the use of a single key structure can achieve the functions of multiple keys. Since different commands are executed according to different pressure sensing signals, the functions of the key structure are increased. Moreover, the flexible layer has a one-piece structure. Consequently, the flexible layer not only transfers the pressing force to the pressure sensing layer but also provides better tactile feel to the user.

Moreover, the pressure sensing layer is disposed on the flat base plate. Since the pressure sensing layer is not disposed on the uneven component (e.g., the top surface of the circuit board), the sensitivity of the pressure sensing layer of the present invention is increased. Moreover, since the pressure sensing layer is located under the circuit board, the wiring layout of the circuit board is not adversely affected by the pressure sensing layer.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A keyboard, comprising:
    a base plate;
    a circuit board located over the base plate, wherein the circuit board comprises at least one circuit board opening;
    plural key structures located over the circuit board, wherein when at least one of the key structures is depressed, the at least one key structure is penetrated through a corresponding circuit board opening, wherein the key structure comprises:
        a pedestal located over the base plate, wherein the pedestal comprises a pedestal opening, and the pedestal opening is aligned with the corresponding circuit board opening;
        an upper cover having an upper cover opening, wherein the pedestal is covered by the upper cover; and
        a triggering element disposed on the pedestal and partially penetrated through the upper cover opening;
    a pressure sensing layer disposed on the base plate and located under the circuit board, wherein while the at least one key structure is depressed, the at least one key structure provides a pressing force and the pressing force is detected by the pressure sensing layer;
    a flexible layer arranged between the pressure sensing layer and the circuit board, wherein when the flexible layer is pressed by the at least one key structure, the pressure sensing layer is pushed by the flexible layer, wherein while the triggering element is depressed, the triggering element is moved relative to the pedestal and a part of the triggering element is penetrated through the pedestal opening and the circuit board opening to press the flexible layer and cause it to push the pressure sensing layer; and
    a controlling unit disposed on the circuit board and electrically connected with the pressure sensing layer, wherein the control unit generates a pressure sensing signal according to the pressing force.

2. The keyboard according to claim 1, wherein the triggering element comprises:
    a main body movable relative to the pedestal;
    a coupling part located at a first end of the main body, wherein the coupling part is penetrated through the upper cover opening so as to be connected with a keycap; and
    a push part located at a second end of the main body and aligned with the pedestal opening, wherein while the main body is moved relative to the pedestal, the push part is penetrated through the pedestal opening and the circuit board opening so as to press the flexible layer.

3. The keyboard according to claim 2, wherein the main body, the coupling part and the push part are integrally formed with each other.

4. The keyboard according to claim 2, wherein the key structure further comprises an elastic element, and the elastic element is sheathed around the push part, wherein the elastic element is contacted with the pedestal to provide an elastic force, wherein in response to the elastic force, the triggering element is moved relative to the pedestal and returned to an initial position.

5. The keyboard according to claim 2, wherein the key structure further comprises a spring strip, and the spring strip is installed on the pedestal and arranged beside the triggering element, wherein the triggering element further comprises a collision part, and the collision part is extended externally from the main body and arranged beside the push part, wherein while the main body is moved relative to the pedestal, the spring strip is collided by the collision part, so that a sound is generated.

6. The keyboard according to claim 2, wherein the controlling unit generates the pressure sensing signal according to a magnitude of the pressing force, wherein if the magnitude of the pressing force is higher than or equal to a predetermined force value, the controlling unit generates the pressure sensing signal corresponding to a first function, wherein if the magnitude of the pressing force is lower than the predetermined force value, the controlling unit generates the pressure sensing signal corresponding to a second function.

7. The keyboard according to claim 1, wherein the key structure comprises a first triggering spring strip and a second triggering spring strip, wherein the first triggering spring strip is disposed on the pedestal and electrically connected with the circuit board, and the second triggering spring strip is disposed on the pedestal, located near the first triggering spring strip and electrically connected with the circuit board, wherein the triggering element comprises:
a main body movable relative to the pedestal;
a coupling part located at a first end of the main body, wherein the coupling part is penetrated through the upper cover opening so as to be connected with a keycap;
a push part located at a second end of the main body and aligned with the pedestal opening, wherein while the main body is moved relative to the pedestal, the push part is penetrated through the pedestal opening and the circuit board opening so as to press the flexible layer; and
a collision part extended externally from the main body and arranged beside the push part, wherein while the main body is moved relative to the pedestal, the first triggering spring strip is collided by the collision part, so that a sound is generated, wherein while the first triggering spring strip is collided by the collision part and the first triggering spring strip and the second triggering spring strip are contacted with each other, the first triggering spring strip and the second triggering spring strip are electrically connected with each other, so that the circuit board generates a key signal.

8. The keyboard according to claim 7, wherein the controlling unit generates the pressure sensing signal according to a magnitude of the pressing force, wherein if the magnitude of the pressing force is higher than or equal to a predetermined force value, the controlling unit generates the pressure sensing signal corresponding to a first function, wherein if the magnitude of the pressing force is lower than the predetermined force value, the controlling unit generates the pressure sensing signal corresponding to an off function, so that the circuit board generates the key signal.

9. The keyboard according to claim 1, wherein the plural key structures are aligned with the flexible layer, wherein the flexible layer is made of rubber material or foam material.

10. The keyboard according to claim 1, wherein the pressure sensing layer comprises plural pressure sensing regions, wherein each of the plural pressure sensing regions is aligned with the key structure to receive the pressing force from the corresponding key structure.

* * * * *